(12) United States Patent  
Schulze

(10) Patent No.: US 8,183,666 B2
(45) Date of Patent: May 22, 2012

(54) SEMICONDUCTOR DEVICE INCLUDING SEMICONDUCTOR ZONES AND MANUFACTURING METHOD

(75) Inventor: Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/608,196

(22) Filed: Oct. 29, 2009

(65) Prior Publication Data

US 2011/0101501 A1 May 5, 2011

(51) Int. Cl.
*H01L 29/06* (2006.01)

(52) U.S. Cl. ........... 257/611; 257/288; 257/E21.135; 257/E29.255; 257/401; 257/901

(58) Field of Classification Search ........... 257/611, 257/288, E21.135, E29.255, 401, 901
See application file for complete search history.

(56) References Cited

U.S. PATENT DOCUMENTS

| | | | |
|---|---|---|---|
| 6,410,958 B1 * | 6/2002 | Usui et al. ........... | 257/329 |
| 2006/0108600 A1 * | 5/2006 | Okumura et al. ........... | 257/135 |
| 2008/0122001 A1 * | 5/2008 | Pfirsch et al. ........... | 257/368 |
| 2008/0179671 A1 * | 7/2008 | Saito et al. ........... | 257/341 |

OTHER PUBLICATIONS

"Production Procedures for a Compensation Construction Element/Procedure to the Defined Load Separation with Twice Doped Starting EPI Layer", Dr. Hans Weber, Construction Elements, Jun. 2002, 5 pgs.

* cited by examiner

*Primary Examiner* — Marc Armand
(74) *Attorney, Agent, or Firm* — Dicke, Billig & Czaja, PLLC

(57) ABSTRACT

A semiconductor device includes first semiconductor zones of a first conductivity type having a first dopant species of the first conductivity type and a second dopant species of a second conductivity type different from the first conductivity type. The semiconductor device also includes second semiconductor zones of the second conductivity type including the second dopant species. The first and second semiconductor zones are alternately arranged in contact with each other along a lateral direction extending in parallel to a surface of a semiconductor body. One of the first and second semiconductor zones constitute drift zones and a diffusion coefficient of the second dopant species is at least twice as large as the diffusion coefficient of the first dopant species. A concentration profile of the first dopant species along a vertical direction perpendicular to the surface of the semiconductor body includes at least two maxima.

25 Claims, 8 Drawing Sheets

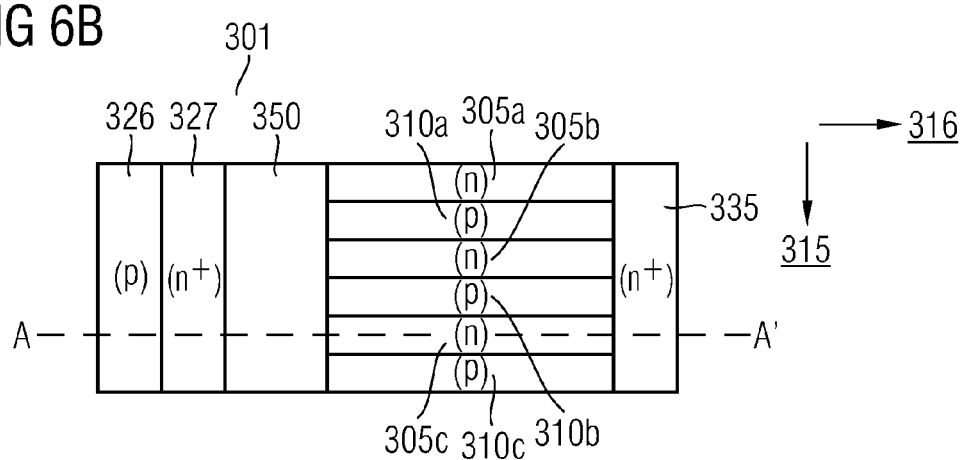
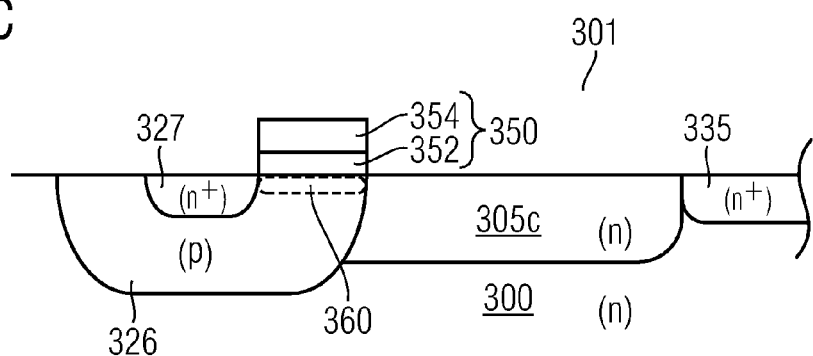
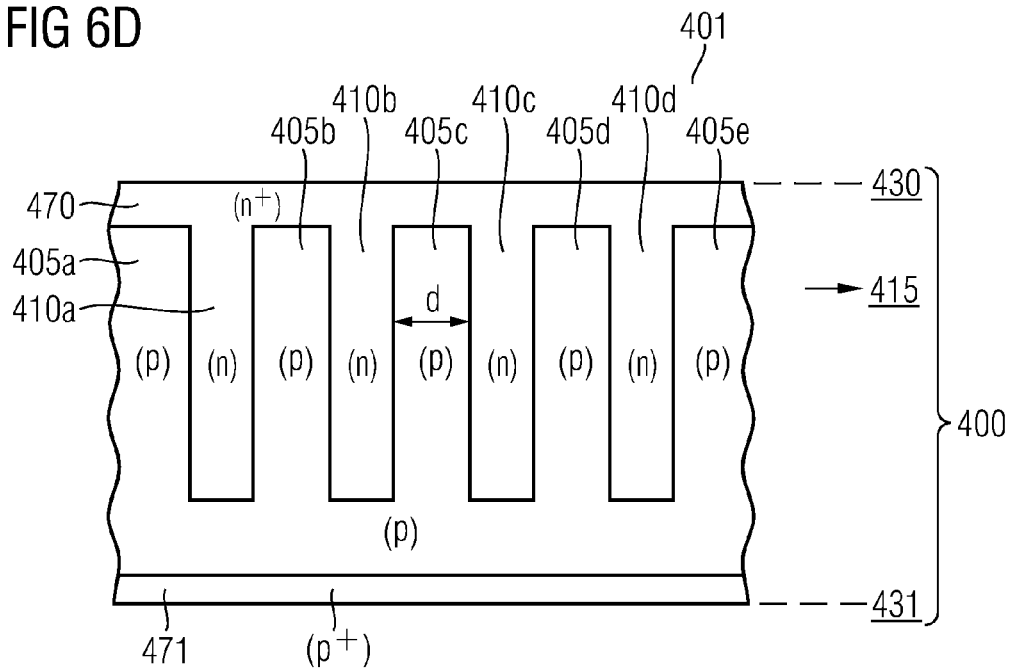

US 8,183,666 B2

SEMICONDUCTOR DEVICE INCLUDING SEMICONDUCTOR ZONES AND MANUFACTURING METHOD

BACKGROUND

Semiconductor compensation devices such as n- or p-channel Metal Oxide Semiconductor Field Effect Transistors (n- or p-channel MOSFETs), diodes, pn-junction detectors, Silicon-Controlled Rectifiers (SCRs) are frequently used semiconductor products. These devices can be based on mutual compensation of the charge of n- and p-doped regions in a semiconductor body of the device. The n- and p-doped regions are spatially arranged such that, in a reverse operation mode, a space charge of the n-doped region compensates the space charge of the p-doped region. By using this compensation of the p- and n-doping, a concentration of dopants of the one of these regions constituting a drift zone can be increased, whereby, despite a possible loss in the current-carrying area, a gain in on-resistance $R_{DS(on)}$ may be achieved. Production tolerances such as lithographic mismatch or deviations of target dopant concentrations may lead to deviations of desired charge compensation of these n- and p-doped regions. This may have a negative impact on device performance such as decreased device breakdown voltage and may limit the maximum doping concentration of the n- and p-doped regions.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts. The features of the various illustrated embodiments can be combined in any way unless they exclude each other.

FIG. 6B illustrates a schematic top view on a semiconductor body portion of one embodiment of a lateral FET.

FIG. 6C illustrates a cross-sectional view along a line A-A' of the lateral FET illustrated in FIG. 6B.

FIG. 6D illustrates a cross-sectional view of a semiconductor body portion of one embodiment of a solar cell.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One or more embodiments provide a semiconductor device including compensation zones having a desired charge compensation of p- and n-doped regions.

Figure 1:
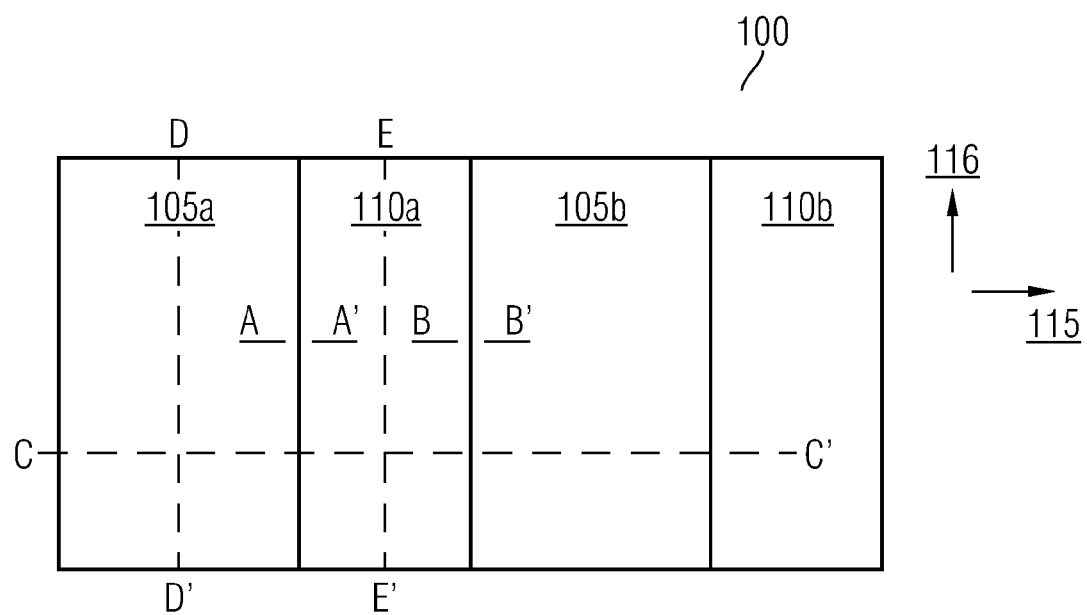
FIG. 1 illustrates one embodiment of a semiconductor device including a cross-sectional view of a semiconductor body portion having subsequently arranged first and second semiconductor zones of different conductivity type.

FIG. 1 illustrates a semiconductor body portion 100 of a semiconductor device including first semiconductor zones 105a, 105b of a first conductivity type and second semiconductor zones 110a, 110b of a second conductivity type different from the first conductivity type. The first and second semiconductor zones are alternately arranged along a lateral direction 115 extending in parallel to a front surface of the semiconductor body. The sequence of arrangement of these zones along the lateral direction 115 is first semiconductor zone 105a, second semiconductor zone 110a, first semiconductor zone 105b, second semiconductor zone 110b. These zones are arranged in contact with each other.

Each of the first semiconductor zones 105a, 105b includes a first dopant species of the first conductivity type and a second dopant species of the second conductivity type. Since each of the first semiconductor zones 105a, 105b is of the first conductivity type, a concentration of the first dopant species is larger within these zones than the concentration of the second dopant species.

Each of the second semiconductor zones 110a, 110b includes the second dopant species. These zones 110a, 110b may also include the first dopant species in a concentration lower than the concentration of the second dopant species.

One of the first and second semiconductor zones, i.e., the first semiconductor zones 105a, 105b or the second semiconductor zones 110a, 110b, constitute drift zones of the device. A diffusion coefficient of the second dopant species is at least twice as large as the diffusion coefficient of the first dopant species.

The device including the semiconductor body portion 100 illustrated in FIG. 1 may include further structural elements not illustrated in FIG. 1, either because these elements are located in a device portion different from the portion illustrated in FIG. 1 or because these elements are not illustrated for reasons of clarity. Examples for these elements not illustrated in FIG. 1 depend up on the type of the device and may include one or a plurality of edge termination structures, measures for increasing avalanche robustness, semiconductor structures including body and source, drain, anode, cathode, gate structures including gate dielectrics and gate electrodes, insulation dielectrics, conductive structures such as contact plugs and metal layers, for example.

The first conductivity type may be an n-type and the second conductivity type may be a p-type. As a further example, the first conductivity type may be the p-type and the second conductivity type may be the n-type.

The first and second semiconductor zones 105a, 105b, 110a, 110b constitute semiconductor compensation zones of different conductivity type. In a reverse operation mode of the device, an overall space charge of at least one of the first semiconductor zones may electrically compensate the space charge of at least one of the second semiconductor zones. An electrically active dose of at least one of the first semiconductor zones may also be smaller than 20%, or 10% or even 5% than the corresponding dose of one of the second semiconductor zones, whereby dose means ∫dN/dx in the first or second semiconductor zones in a lateral direction x such as lateral direction 115 whereby N is the effective concentration of n-type of p-type charge carriers.

Materials of the first and second dopant species may include P and In, Ga and P, B and Sb, In and Sb, Ga and Sb, B and As, In and As, Ga and As. As an example, when combining P and In, the n-type species, i.e., P, is diffusing faster in silicon than In. Thus, a drift zone including one dopant species may be achieved. This may result in a higher mobility of free charge carriers in the n-type drift zone and a lower $R_{DS(on)}$. The diffusion coefficients of combinations of first and second dopant species may differ from each other by at least a factor of 2 with regard to a base material such as silicon. Thus, formation of the first and second semiconductor zones 105a, 105b, 110a, 110b having different conductivity type may be achieved by utilizing the different diffusion characteristics of these dopants within the semiconductor body. For example, after diffusing the first and second dopant species into an intrinsic semiconductor volume, the conductivity type of the previously intrinsic semiconductor volume may be defined by the conductivity type of the dopant species having the larger diffusion coefficient, whereas the conductivity type of the semiconductor volume out of which these semiconductor species have been diffused, may be defined by the conductivity type of the other dopant species having the lower diffusion coefficient.

One of the first and second semiconductor zones 105a, 105b, 110a, 110b may include at least one epitaxial semiconductor layer grown on a semiconductor substrate along a vertical direction 116 perpendicular to the lateral direction 115. The other one of the first and second semiconductor zones 105a, 105b, 110a, 110b may be arranged within trenches formed within the semiconductor body 100. These zones may include epitaxial semiconductor layers grown on sidewalls of the trenches along the lateral direction 115.

The first and/or second dopant species may be implanted into the semiconductor body. Thus a beneficial precision of charge compensation of the first and second semiconductor zones 105a, 105b, 110a, 110b may be achieved. The first and/or second dopant species may be implanted by using a plurality of implant doses and/or a plurality of implant energies. When forming one of the first and second semiconductor zones 105a, 105b, 110a, 110b by a plurality of epitaxial semiconductor layers grown on a semiconductor substrate, one or both of the first and second dopant species may be implanted after formation of each of the epitaxial semiconductor layers. As a further example, one of the first and second dopant species, e.g., the one having the larger diffusion coefficient, may be merely implanted into some, e.g., every second or every third, of the subsequently grown epitaxial semiconductor layers. An implant dose of the first and/or second dopant species may be chosen larger for the uppermost and/or lowermost of the plurality of epitaxial semiconductor layers compared to the other ones of these layers, e.g., the implant dose of the faster diffusing dopant species may be chosen higher for the uppermost and/or lowermost layers. Thereby, diffusion of the first and/or second dopant species into a vertical direction through a bottom side or top side of the layer stack of the plurality of semiconductor epitaxial layers may be counterbalanced. The implantation doses of the first and second dopant species used for the implantation into the plurality of epitaxial layers may be chosen so that in the fully processed device an electrically active dose of at least one of the first semiconductor zones may also be smaller than 20%, or 10% or even 5% than the corresponding dose of one of the second semiconductor zones.

Apart from the semiconductor body portion 100 illustrated in FIG. 1, the semiconductor body may include a semiconductor substrate such as a silicon substrate or a Silicon-On-Insulator (SOI) substrate. The semiconductor substrate may also include one or a plurality of semiconductor layers such as epitaxial semiconductor layers formed thereon. The semiconductor body portion 100 may also be part of a doped semiconductor wafer, e.g., a doped Float-Zone (FZ) or Czochralski (CZ) silicon crystal material.

Figure 2:
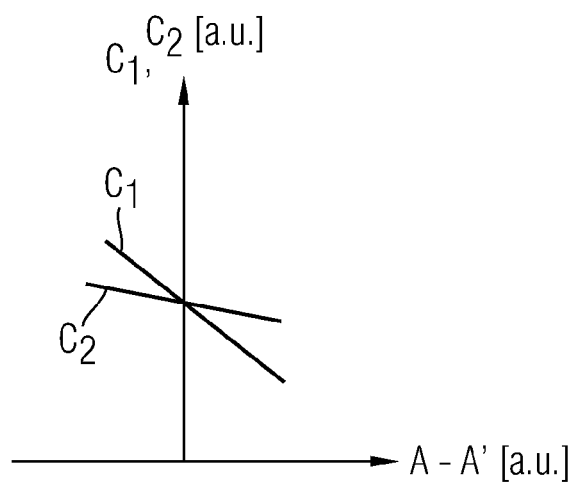
FIG. 2 illustrates a schematic diagram of an example of a concentration profile of first and second dopant species along a lateral direction A-A' illustrated in the cross-sectional view of FIG. 1.

FIG. 2 illustrates a schematic diagram of an example of a concentration profile of the first and second dopant species C1, C2 along the lateral direction A-A' illustrated in FIG. 1.

A concentration C1 of the first dopant species having the first conductivity type is larger within the first semiconductor zone 105a (i.e., left part of graph illustrated in FIG. 2) than the concentration C2 of the second dopant species having the second conductivity type. Contrary thereto, the concentration C2 of the second dopant species is larger within the second semiconductor zone 110a (i.e., right part of graph illustrated in FIG. 2) than the concentration C1 of the first dopant species within this zone. Thus, the conductivity type of first semiconductor zone 105a corresponds to the conductivity type of the first dopant species and the conductivity of the second semiconductor 110a corresponds to the conductivity type of the second dopant species.

In other words, a concentration of the dopants of each of the first and second species at an interface between one of the first semiconductor zones 105a, 105b and one of the second semiconductor zones 110a, 110b is decreasing along the lateral direction from the first to the second semiconductor zones. The dopant profiles intersect at the interface, whereas a gradient of the profile is larger for the first dopant species than the second dopant species.

Figure 3:
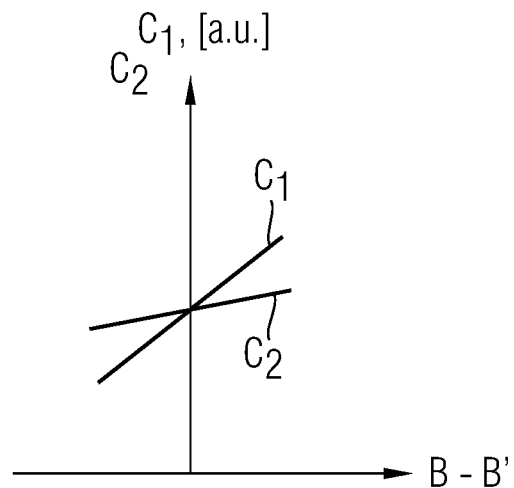
FIG. 3 illustrates a schematic diagram of an example of the concentration profile of the first and second dopant species along the lateral direction B-B' illustrated in the cross-sectional view of FIG. 1.

FIG. 3 illustrates a schematic diagram of an example of a profile of concentration C1, C2 of the first and second dopant species along the lateral direction B-B' illustrated in FIG. 1.

A concentration C1 of the first dopant species is larger within the first semiconductor zone 105b (i.e., right part of graph illustrated in FIG. 3) than the concentration C2 of the second dopant species. Contrary thereto, the concentration C2 of the second dopant species is larger within the second semiconductor zone 110a (i.e., left part of graph illustrated in FIG. 3) than the concentration C1 of the first dopant species. Thus, a conductivity type of the first semiconductor zone 105b corresponds to the conductivity type of the first dopant species and the conductivity type of the second semiconductor 110a corresponds to the conductivity type of the second dopant species.

Figure 4A:
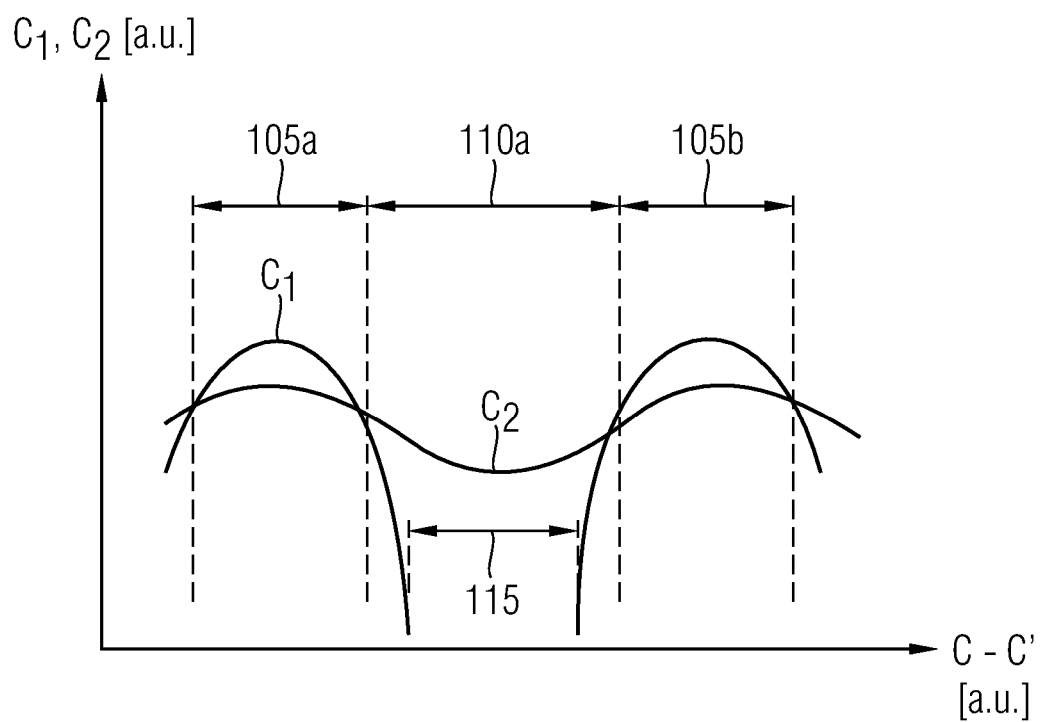
FIG. 4A illustrates a schematic diagram of a first example of a concentration profile of the first and second dopant species along a lateral direction C-C' illustrated in the cross-sectional view of FIG. 1.

FIG. 4A illustrates one example of a profile of concentrations C1, C2 of first and second dopant species along the lateral direction C-C' of the semiconductor body portion 100 illustrated in FIG. 1.

An intersection area between the profile of concentration C1 of the first dopant species and the profile of concentration C2 of the second dopant species defines an interface between a first semiconductor zone such as semiconductor zone 105a having a concentration C1 of the first dopant species that is larger than the concentration C2 of the second dopant species and a second semiconductor zone such as semiconductor zone 110a having a concentration C2 of the second dopant species that is larger than the concentration C1 of the first dopant species. A schematic profile of concentrations C1, C2 such as illustrated in FIG. 4A may be manufactured by diffusing first and second dopant species from a volume of the first semiconductor zones such as the semiconductor zones 105a, 105b into a volume of the second semiconductor zone such as the second semiconductor zone 110a, which may be undoped.

In the example illustrated in FIG. 4A, a diffusion coefficient of the second dopant species is at least twice as large as the diffusion coefficient of the first dopant species. A maximum of the concentration of dopants C1, C2 of each of first and second dopant species along the lateral direction C-C' is located in the center of each of the first semiconductor zones 105a, 105b having a same lateral distance to the neighboring ones of the second semiconductor zones. A minimum of the concentration C2 of the second dopant species is located in the center of each of the second semiconductor zones such as the second semiconductor zone 110a having a same lateral distance to the neighboring ones of the first semiconductor zones such as the first semiconductor zones 105a, 105b.

In the example illustrated in FIG. 4A, a region 115 free of first dopant species remains within each of the second semiconductor zones such as the second semiconductor zone 110a. A corrugation of each of the profile of concentration C1, C2 may be influenced by a plurality of parameters such as dimensions and distance of the regions acting as a diffusion reservoir, diffusion coefficients of the respective dopant species or thermal budget and time of diffusion of the respective species, for example.

Figure 4B:
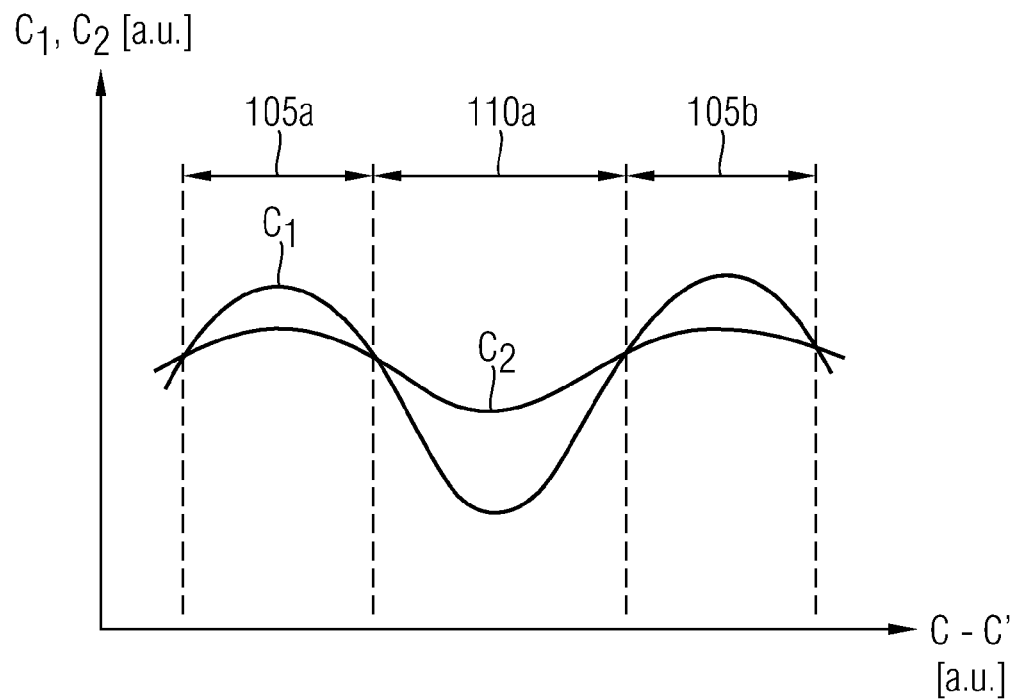
FIG. 4B illustrates a schematic diagram of a second example of the concentration profile of the first and second dopant species along the lateral direction C-C' illustrated in the cross-sectional view of FIG. 1.

The schematic diagram of FIG. 4B illustrates another example of a profile of concentrations C1, C2 along the lateral direction C-C' of the semiconductor body portion 100 of the device illustrated in FIG. 1. With regard to the location of maxima and minima the profile of concentration C2 of the second dopant species is similar to the example illustrated in FIG. 4A.

The profile of concentration C1 of the first dopant species differs from the corresponding profile illustrated in FIG. 4A in that the first dopant species are located in an overall volume of second semiconductor zones such as the second semiconductor zone 110a. Thus, diffusion of the first dopant species out of neighboring diffusion reservoirs such as reservoirs located within first semiconductor zones 105a, 105b, is effected such that the two diffusion profiles will overlap and no semiconductor volume 115 free of first dopant species remains with the second semiconductor zones such as semiconductor zone 110a illustrated in FIG. 4A.

Figure 5A:
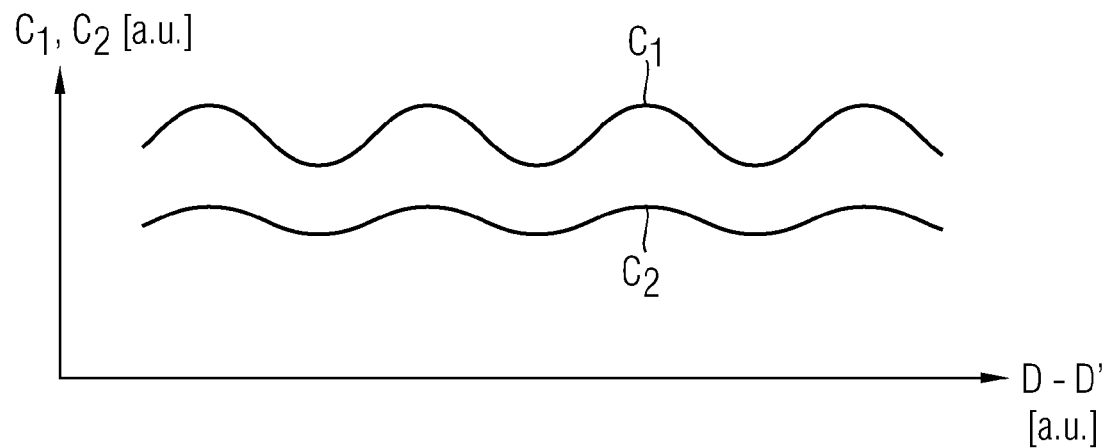
FIGS. 5A-5B illustrate schematic diagrams of a first and a second example of a concentration profile of the first dopant and second dopant species along a vertical direction D-D' illustrated in the cross-sectional view of FIG. 1.

FIG. 5A illustrates one example of a profile of concentrations C1, C2 of the first and second dopant species along a vertical direction D-D' of the first semiconductor zone 105a within a semiconductor body portion 100 of the device illustrated in FIG. 1.

Both, the profile of concentration C1 of the first dopant species and the profile of concentration C2 of the second dopant species include maxima and minima along the vertical direction D-D'. The concentration C1 of the first dopant species is larger than the concentration C2 of the second dopant species. Thus, a conductivity type of this semiconductor zone 105a equals the conductivity type of the first dopant species.

The number of maxima of the concentration profiles C1, C2 of each of the first and second dopant species along the vertical direction D-D' may correspond to the number of epitaxial semiconductor layers formed on a semiconductor substrate. The first and second dopant species may be implanted into each of the semiconductor epitaxial layers. Each implant into one of the semiconductor epitaxial layers may be carried out after formation of the one of the semiconductor epitaxial layers and before formation of the next one of the epitaxial semiconductor layers, for example. An implant dose of the first species may be equal to the implant dose of the second dopant species. These doses may also be nearly the same differing from each other by less than 20%, or 10%, or 5%, or 3% or 1% for at least one of the epitaxial semiconductor layers. As an example, by adjusting the implant doses of the first and second dopant species to different values, e.g., to above embodiment values, a production tolerance with regard to the breakdown voltage of the resulting device may be improved. The maxima of the profile of concentration C1, C2 of the first and second dopant species may be shifted from each other along the vertical direction D-D' subject to implant energies chosen for implant of the first and second dopant species, for example.

Associated with the example of profiles of concentration C1, C2 illustrated in FIG. 5A is a profile of concentration C1, C2 of first and second dopant species along the vertical direction E-E' in the semiconductor body portion 100 of FIG. 1. This profile may also include maxima and minima along the vertical direction E-E'. In contrast to the relation C1>C2 holding true for the profiles along the vertical direction D-D' illustrated in FIG. 5A, C2>C1 may apply for the profiles along the vertical direction E-E' (not illustrated).

Figure 5B:
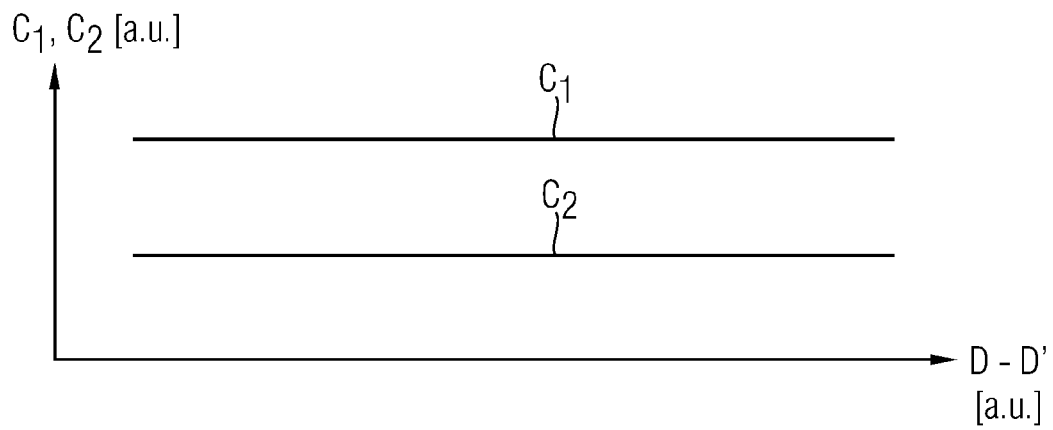

FIG. 5B illustrates another example of a profile of concentrations C1, C2 along the vertical direction D-D' in the first semiconductor zone 105a of the semiconductor device portion 100 illustrated in FIG. 1.

Figure 5C:
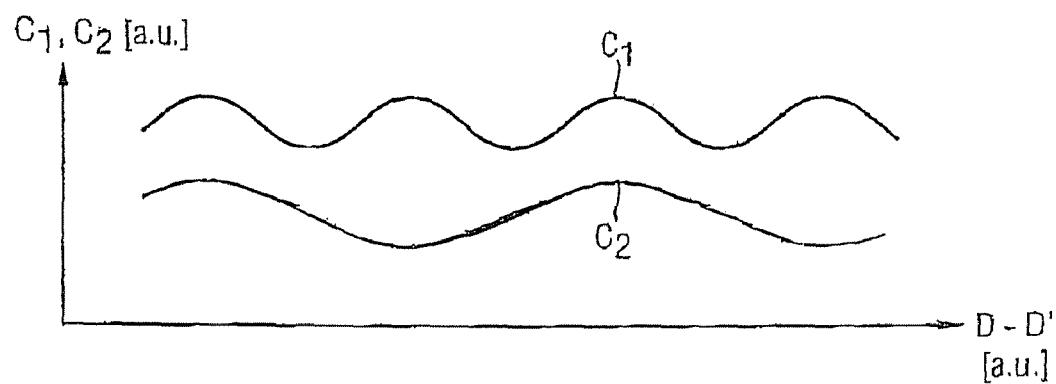
FIG. 5C illustrates a schematic diagram of concentration profiles of the first and second dopant species along the vertical direction D-D' illustrated in the cross-sectional view of FIG. 1.

In FIG. 5C, the concentration profile C2 of the second dopant species having the larger diffusion coefficient includes less maxima along the vertical direction D-D' than the concentration profile C1 of the first dopant species. This may be achieved by using plural implant energies when implanting the second dopant species and/or, when forming a plurality of semiconductor epitaxial layers constituting the first semiconductor zones 105a, 105b, by implanting the second dopant species into less of these epitaxial layers than the first dopant species. One or both of these profiles may also slightly vary along the vertical direction D-D', e.g., by a fraction of 5%, or 10% or 20%. Such variations may allow to improve the avalance robustness of the device or to improve the production tolerance with regard to the breakdown voltage of the device. As an example a concentration of the one of the dopants constituting the drift zone may have a peak maximum along the vertical direction D-D' which is higher than the other maxima, e.g., in a center of the drift zone along the vertical direction D-D'. This example may allow to improve avalanche robustness of the device. As another example, a concentration of the one of the dopants constituting the drift zone may have a peak maximum at or close to a top side and/or bottom side of the drift zone, the peak maximum being higher that the other maxima in the vertical direction. This further example may allow to counterbalance vertical diffusion of dopants out of the drift zones to be formed.

Associated with the example of profiles of concentration C1, C2 illustrated in FIG. 5B are profiles of concentration C1, C2 of first and second dopant species along the vertical direction E-E' in the semiconductor body portion 100 of FIG. 1. In contrast to the relation C1>C2 holding true for the profiles along the vertical direction D-D', C2>C1 may apply for the profiles along the vertical direction E-E' (not illustrated).

Other examples of profiles of dopant concentrations C1, C2 along the vertical direction D-D' may include parts having maxima and minima and other parts of constant dopant concentration. Such profiles may be manufactured by a combination of in-situ doping and doping by implant of dopants, for example.

Figure 6A:
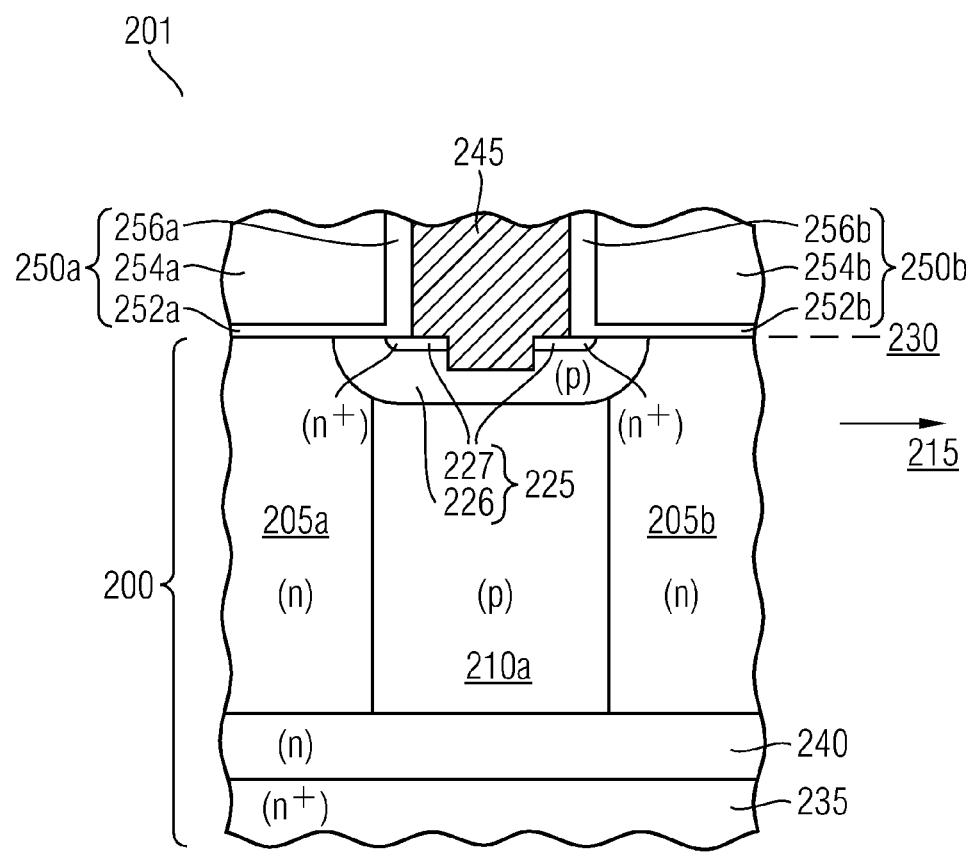
FIG. 6A illustrates a cross-sectional view of a semiconductor body portion of one embodiment of a vertical FET.

FIG. 6A illustrates a schematic cross-sectional view of a portion of a vertical FET 201 including n-type semiconductor zones 205a, 205b and p-type semiconductor zone 210a. These semiconductor zones are sequentially arranged along the lateral direction 215 in the sequence of first semiconductor zone 205a, second semiconductor zone 210a and first semiconductor zone 205b. The profile of concentrations of the first and second dopant species within these semiconductor zones may correspond to any of the respective examples above. The first semiconductor zones 205a, 205b constitute drift zones of FET 201. In a reverse operation mode of FET 201, free carriers may be removed from these regions and charge compensation between the first and second semiconductor zones may be achieved, i.e., the space charge of one of the first zones may electrically compensate the space charge of one of the second zones.

FET 201 includes a semiconductor structure 225 having a p-type body region 226 and $n^+$-type source region 227 formed at a front surface 230 of a semiconductor body portion 200.

An $n^+$-type drain 235 is formed at a back surface of the semiconductor body portion 200 opposite to the front surface 230. An n-type semiconductor zone 240 may be arranged between the first and second semiconductor zones 205a, 205b, 210a and the $n^+$-type drain 235. The n-type semiconductor zone 240 may have a concentration of dopants equal to the first semiconductor zones 205a. According to another example, a concentration of dopants of semiconductor zone 240 may be higher or lower than the concentration of the first semiconductor zones 205a, 205b. The semiconductor zone 240 may be a field stop zone configured to improve robustness such as avalanche robustness of FET 201 by compensation of free electrons flowing as a leakage current in the blocking state, for example.

At the front surface 230, a conductive structure 245 is electrically coupled to the semiconductor structure 225. The conductive structure 245 may include conductive elements such as contact plugs and conductive layers of conductive material such as metals and/or doped semiconductors. The conductive structure 245 is configured to provide an electrical interconnection between device 201 and further elements such as further circuit devices or chip pads, for example.

FET 201 also includes gate structures 250a, 250b including gate dielectrics 252a, 252b, gate electrodes 254a, 254b and insulating layers 256a, 256b.

FIG. 6B illustrates a schematic cross-sectional view of a portion of a lateral FET 301 including n-type semiconductor zones 305a . . . 305c and p-type semiconductor zones 310a . . . 310c. These semiconductor zones are sequentially arranged along a lateral direction 315 in the sequence of first semiconductor zone 305a, second semiconductor zone 310a, second semiconductor zone 310a, first semiconductor zone 305b, second semiconductor zone 310b, first semiconductor zone 305c and second semiconductor zone 310c. The profile of concentrations of the first and second dopant species within these semiconductor zones may correspond to any of the respective examples above. The first semiconductor zones 305a . . . 305c constitute drift zones of FET 301. In a reverse operation mode of FET 301, free carriers may be removed from these regions and charge compensation between the first and second semiconductor zones may be achieved, i.e., the space charge of one of the first zones may electrically compensate the space charge of one of the second zones.

FET 301 also includes an $n^+$-type drain 335 and a p-type body region 326. The first and second semiconductor zones 305a . . . 305c, 310a . . . 310c are arranged between the $n^+$-type drain 335 and the p-type body region 326 along the lateral direction 316. An $n^+$-type source region 327 is embedded within p-type body region 326 and a gate structure 350 is arranged so as to control the conductivity in a channel region between the $n^+$-type source region 327 and the drift zones by field effect. FET 301 may also include additional elements such as semiconductor regions not illustrated for reasons of clarity.

FIG. 6C illustrates a cross-sectional view of FET 301 illustrated in FIG. 6B along the line A-A'. The first and second semiconductor zones such as first semiconductor zone 305c constituting part of the drift zone, $n^+$-type drain 335, p-type body region 326 and $n^+$-type source region 327 are formed within a n-type semiconductor body portion 300. The gate structure 350 including a gate dielectric 352 and a gate electrode 354 is formed on the p-type body region 326. The gate structure 350 is arranged so as to control the conductivity of a lateral channel region 360 between the $n^+$-type source region 327 and the drift zones such as first semiconductor zone 305c by field effect. FET 301 may also include additional elements such as semiconductor regions or contact plugs not illustrated for reasons of clarity.

FIG. 6D illustrates a schematic cross-sectional view of a semiconductor body portion 400 of a solar cell 401 or a radiation detector including p-type semiconductor zones 405a . . . 405e and n-type semiconductor zones 410a . . . 410d. These semiconductor zones are sequentially arranged along a lateral direction 415. The profile of concentrations of the first and second dopant species within these semiconductor zones may correspond to any of the respective examples above. The electrically active dose of the vertical p- and n-type regions may differ more than for compensation devices, the difference ranging, for example, up to a factor of 10 or 5 or 2 or 50% or 20%. The first semiconductor zones 405a . . . 405e constitute base zones (drift zones) of solar cell 401 and the second semiconductor zones 410a . . . 410d constitute relatively low doped emitter zones of solar cell 401. A highly doped $n^+$-type emitter 470 is formed at a front surface 430 of semiconductor body portion 400 and a $p^+$-type base contact region 471 is formed at a back surface 431 of the semiconductor body portion 400. A lateral distance d between two neighboring ones of the first semiconductor zones 405a . . . 405e may be within a range of several tenth parts of the diffusion length to several diffusion lengths of electrons within the first semiconductor zones 405a . . . 405e.

Figure 7:
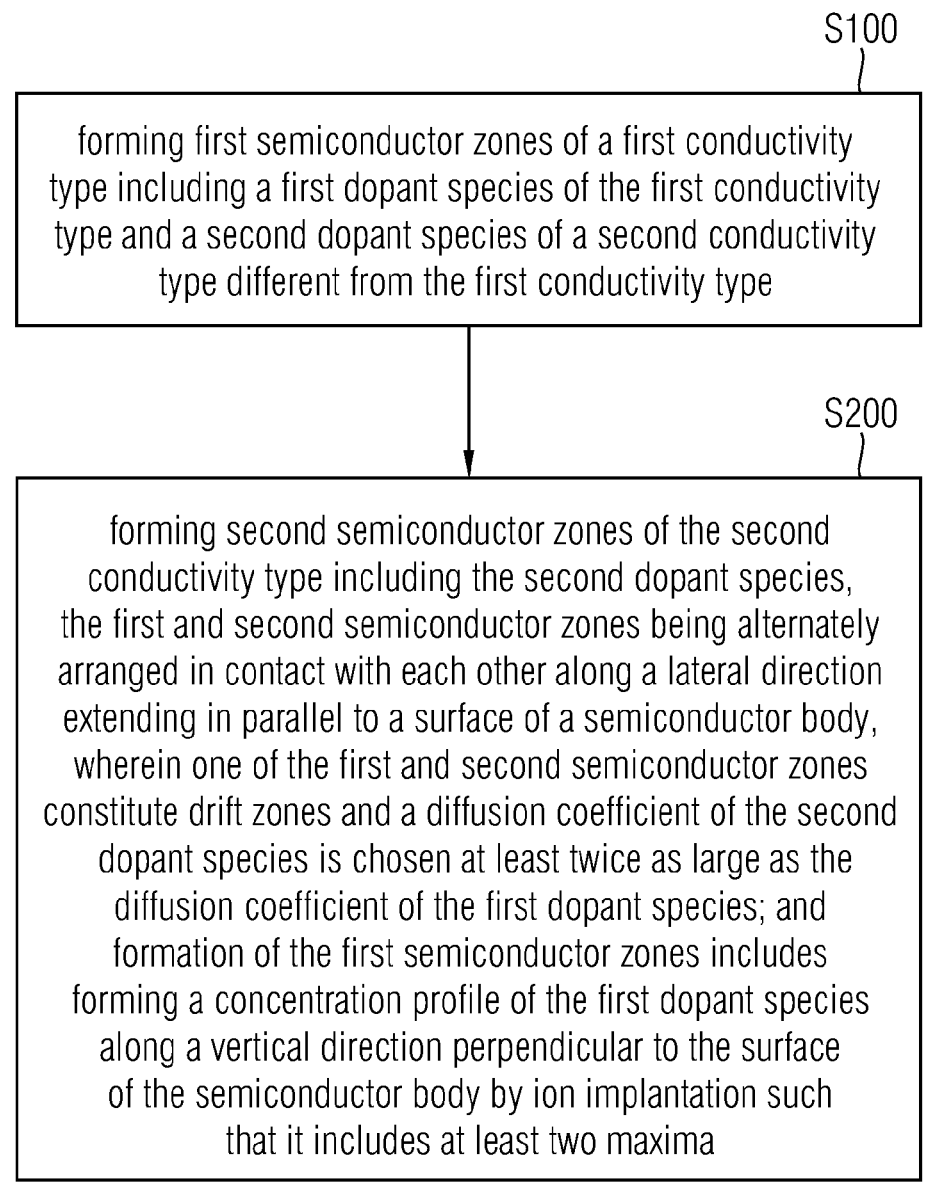
FIG. 7 is a simplified flowchart illustrating a method for manufacturing a semiconductor device including compensation zones according to an embodiment.

FIG. 7 illustrates a simplified flowchart of a method for manufacturing a semiconductor device according to one embodiment.

At S100, first semiconductor zones of a first conductivity type are formed, the first semiconductor zones including a first dopant species of the first conductivity type and a second dopant species of a second conductivity type different from the first conductivity type.

At S200, second semiconductor zones of the second conductivity type are formed, the second semiconductor zones including the second dopant species. The first and second semiconductor zones are alternately arranged in contact with each other along a lateral direction extending in parallel to a surface of a semiconductor body, wherein one of the first and second semiconductor zones constitute drift zones and a diffusion coefficient of the second dopant species is chosen at least twice as large as the diffusion coefficient of the first dopant species. Formation of the first and second semiconductor zones may be simultaneously and formation of the first semiconductor zones includes forming a concentration profile of the first dopant species along a vertical direction perpendicular to the surface of the semiconductor body by ion implantation such that it includes at least two maxima.

The schematic cross-sectional views of FIGS. 8A to 8E illustrate an example of a method for manufacturing a semiconductor device including semiconductor compensation zones.

Figure 8A:
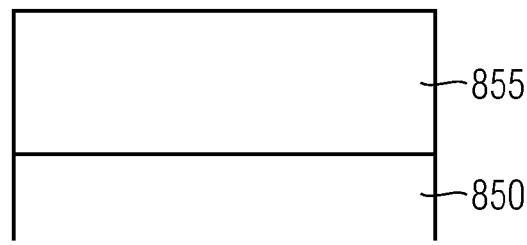
FIG. 8A is a schematic cross-sectional view of a semiconductor body portion for illustrating a method of manufacturing a semiconductor device in accordance with an embodiment.

Referring to the schematic cross-sectional view of FIG. 8A, a semiconductor substrate 850 is provided having an epitaxial layer 855 formed thereon. A thickness of the epitaxial layer 855 may be in a range of 3 µm to 15 µm, for example.

Figure 8B:
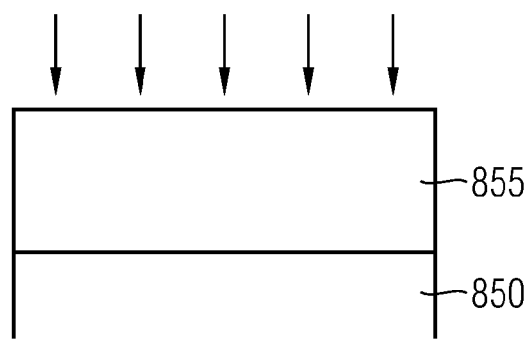
FIG. 8B illustrates a schematic cross-sectional view of the semiconductor body portion of FIG. 8A during implant of first dopant species and second dopant species.

Referring to the schematic cross-sectional view of FIG. 8B, a first dopant species of a first conductivity type and a second dopant species of a second conductivity type different from the first conductivity type are implanted into the epitaxial layer 855. Materials of the first and second dopant species may include P and In, Ga and P, B and Sb, In and Sb, Ga and Sb, B and As, In and As, Ga and As. Materials of the first and second dopant species may be chosen such that their diffusion coefficients with regard to the base material, e.g., silicon, differ from each other by at least a factor of 2. Thus, with regard to silicon as the base material, B and P may not be materials suited for the first and second dopant species, for example.

The dopant species may be implanted into the epitaxial layer 855 using one or plural implant doses and one or plural implant energies. The process of forming the epitaxial layer 855 and implanting dopants into the epitaxial layer 855 may be repeated to provide a plurality of doped epitaxial semiconductor layers on the semiconductor substrate 850. In this way, a thickness of the drift zone may increase to a range of 10 µm to several 100 µm. Doping some of the epitaxial semiconductor layers 855 with one of the first and second dopant species or both of the first and second dopant species may also be carried out in-situ, i.e., during formation of the epitaxial layer 855. In this case the thickness of the epitaxial semiconductor layer may be within a range of 10 µm to several 100 µm. When forming a plurality of semiconductor epitaxial layers, any combination of undoped, i.e., intrinsic epitaxial layers, in-situ doped epitaxial layers and epitaxial layers doped by implant of dopant species may be applied provided that the final layer stack constituting the drift zone includes the first dopant species and the second dopant species and at least part of these layers are doped by implant of dopant species. An overall amount of the first dopant species may correspond to the overall amount of the second dopant species. Thereby, precise charge compensation between the first and second semiconductor zones may be achieved by defining these zones on the basis of different diffusion profiles of the first and second dopant species. An implant dose of the first species may be equal to the implant dose of the second dopant species. These doses may also be nearly the same differing from each other by less than 20%, or 10%, or 5%, or 3% or 1% for at least one of the epitaxial semiconductor layers. As an example, by adjusting the implant doses of the first and second dopant species to different values, e.g., to above embodiment values, a production tolerance with regard to the breakdown voltage of the resulting device may be improved.

According to another example, a semiconductor substrate including the first and second dopant species may be provided. Thus, the process of implanting dopants illustrated in FIG. 8B is not required. An overall amount of the first dopant species may correspond to the overall amount of the second dopant species. The manufacturing method may continue with the processes illustrated in FIGS. 8C to 8E. An example of a doped semiconductor substrate is a semiconductor wafer doped with the first and second dopant species, e.g., doped Float-Zone (FZ) or Czochralski (CZ) or magnetic Czochralski (MCZ) silicon crystal material. When applying the manufacturing process for production of solar cells or detectors, doped semiconductor wafers may be used, for example. In case of solar cells and radiation detectors charge carriers generated by light absorption may have to diffuse a distance to a charge separating junction such as a pn junction. In case this distance is smaller than the diffusion length of the minority charge carriers these carriers likely contribute to the photocurrent and quantum efficiency may be increased. Above structure including the first and second semiconductor zones may be beneficial for such devices including vertical pn junctions. As an example, a lateral distance between two neighboring ones of the first and/or second semiconductor zones may be within a range of several tenth parts of the diffusion length to several diffusion lengths of the minority charge carriers in the respective one of the first and second semiconductor zones.

Thermal heating may be applied to diffuse the implanted dopant species. Thereby, a distribution of the implanted dopant species may be smoothed along a vertical direction perpendicular to a front surface. Prior to thermal heating, a capping layer such as $SiO_2$ may be formed to cover the front surface. This capping layer which may prevent outdiffusion of the implanted dopant species during this thermal heating may be removed in a later process. Prior to thermal annealing a vertical concentration profile such as a vertical implant profile of the one of the first and second dopant species having stronger diffusion may include an absolute maximum at a back side and/or the front side and one or several local maxima between the front side and the back side. Thereby enhanced vertical diffusion out of the silicon wafer or into the substrate of the one of the first and second dopant species having faster diffusion may be counter balanced.

Figure 8C:
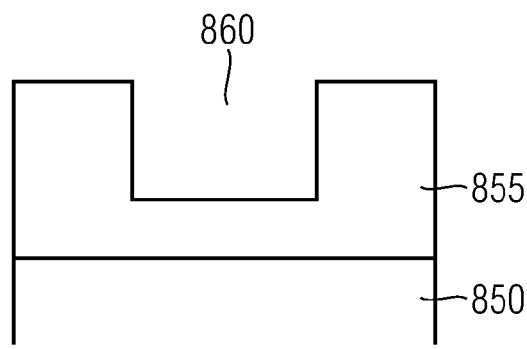
FIG. 8C illustrates a schematic cross-sectional view of the semiconductor body portion of FIG. 8B after forming a trench into the semiconductor body portion.

Referring to the schematic cross-sectional view illustrated in FIG. 8C, a trench 860 is formed within the epitaxial layer 855. The trench 860 may be formed by an etch process, for example. In the example illustrated in FIG. 8C, a bottom side of the trench 860 is located above a top side of the semiconductor substrate 850. According to another example, the trench 860 may extend into the semiconductor substrate 850 or may end at an interface between the epitaxial layer 855 and the semiconductor substrate 850.

Figure 8D:
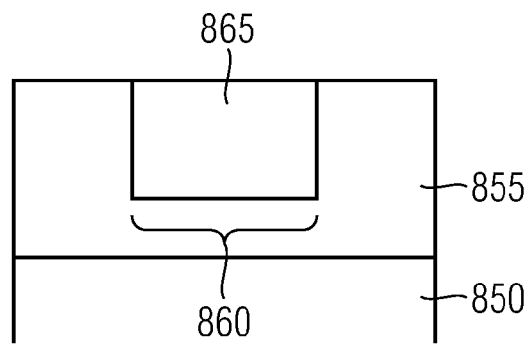
FIG. 8D illustrates a schematic cross-sectional view of the semiconductor body portion of FIG. 8C after filling the trench with a semiconductor material.

Referring to the schematic cross-sectional view illustrated in FIG. 8D, the trench is filled with a filling material 865 including at least a semiconductor material. As an example, the trench 860 may be filled by lateral epitaxy, i.e., by forming epitaxial layers on sidewalls of the trench 860. The epitaxial layers may be formed as intrinsic layers such as intrinsic Si layers. According to another example, the epitaxial layers may be doped in-situ. In latter case, a dopant concentration within the in-situ doped epitaxial layers may be smaller than the concentration of the first and second dopant species. After filling the trench 860, planarization and/or formation of a capping layer such as $SiO_2$ on the front side may be carried out.

Figure 8E:
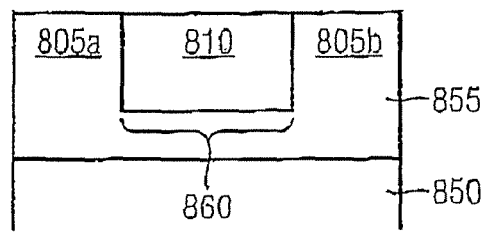
FIG. 8E illustrates a schematic cross-sectional view of the semiconductor body portion of FIG. 8D after diffusion of dopants into the semiconductor material filled in the trenches so as to define first semiconductor zones of a first conductivity type and second semiconductor zones of a second conductivity type different from the first conductivity type.

Referring to the schematic cross-sectional view of FIG. 8E, the first and second dopant species are diffused into a volume of the filled trench 860 by thermal heating. Due to the different diffusion coefficients of the first and second dopant species having different conductivity type, first zones 805a, 805b and a second zone 810 of different conductivity type are formed since the species having the larger diffusion coefficient will define the conductivity type within a volume of the filled trench 860. Assuming that the diffusion coefficient of the second dopant species is at least twice as large than the diffusion coefficient of the first dopant species, a conductivity type of the first zones 805a, 805b corresponds to the conductivity type of the first dopant species and the conductivity type of the second zone 810 corresponds to the conductivity type of the second dopant species. Examples of profiles of the first and second dopant species along a lateral and vertical direction within the first and second semiconductor zones are illustrated above with reference to in FIGS. 1 to 5B.

Due to the difference in diffusion coefficients of the first and second dopant species, a semiconductor structure including a sequence of p-type and n-type semiconductor regions such as stripes or columns may be formed. Regardless of the thermal budget applied a beneficial charge compensation of these n- and p-type regions may be achieved since the one of the first and second dopant species having a larger diffusion coefficient partically counteract the doping of the other one of these dopant species in a first portion having its conductivity defined by the other one of these dopant species, i.e., the dopant species having the smaller diffusion coefficient, whereas the one of these dopant species defines the conductivity type and dimensions of a second portion adjoining the first portion. That means the state of the charge compensation which has been realized before etching and prior to the lateral out diffusion into the filled trench remains nearly unchanged because the faster diffusing dopant species remaining in portion one partially compensates the slower diffusing dopant species so that this difference which corresponds to the electrically active doping dose in portion one is equal to the amount of the difference of the faster and slower diffusing dopant species and, consequently, the electrically active doping dose in portion two.

A value of the resulting dopant concentration of the portions constituting current path regions during operation such as drift zones may be adjusted by the dimensions such as width and form of the first portions and dimensions such as width and form of the second portions, implant doses and types of dopant species, temperature and duration of diffusion process for the first and second dopant species, for example. Before the diffusion of the first and second dopant species, these second portions may have been intrinsic regions formed within trenches. Thus, compensation zones having higher doping levels compared to compensation zones of existing devices such as doping levels of larger than $10^{16}$ cm$^{-3}$, larger than several times $10^{16}$ cm$^{-3}$ or larger than $10^{17}$ cm$^{-3}$ may be achieved.

Furthermore, a vertical variation of the doping levels may be kept smaller than in existing similar devices and the vertical pn junctions may exhibit a negligible curvature enabling low $R_{on}$ values for a given breakdown voltage of the device. The vertical variations of the doping levels may be kept substantially smaller than in existing similar devices provided that the difference between the maxima and minima illustrated in FIG. 5A is minimized by an appropriate selection of high temperature processes. The manufacturing costs of the proposed devices may be kept small since one lithography process may suffice to manufacture a drift zone with a charge compensation structure. Furthermore, a degree of charge compensation is independent from lithographic misalignment.

Further processes such as formation of body, source and drain and controlled thinning of a substrate such as a wafer from a back side may follow to finalize the desired semiconductor device. Examples for the semiconductor device manufactured by above method include MOSFETs, Insulated Gate Bipolar Transistors (IGBTs), SCRs, diodes, solar cells and pn junction radiation detectors, for example.

The first and/or second semiconductor zones constituting the compensation structure may be in the shape of stripes, columns, rings, hexagons, octagons and complementary structures, for example. When using stripes for the shape of the compensation structure, a width of the trenches and a distance between the trenches may be within a range of 100 nm and 10 µm, or between 200 nm and 3 µm.

In the area of an edge termination of the devices a distance and/or width of the trenches may be varied so as to lower the effective dopant concentration in this area, e.g., by increasing the width of or omitting some of the trenches. In addition or in one embodiment, conventional edge termination structures such as field plates and/or field rings may be used.

Figure 9:
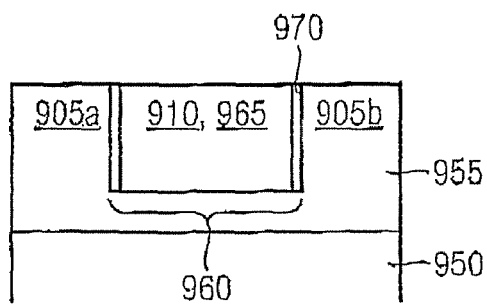
FIG. 9 illustrates a schematic cross-sectional of the semiconductor body portion of FIG. 8C after forming a barrier diffusion layer and filling the trench with a semiconductor material.

Referring to the schematic cross-sectional view of FIG. 9 in conjunction with FIGS. 8A-8E, another example of manufacturing a semiconductor device is illustrated. This method differs from the method illustrated in FIGS. 8A to 8E by the additional formation of a diffusion barrier 970 within the trench 960 along the sidewalls of the trench prior to the filling of the trench 960 with a filling material 965. A material of the diffusion barrier 970 may be chosen such that it hinders diffusion of one the first and second dopant species from the first zones 905a, 905b into the second zones 910. As an example, a diffusion barrier including layers of $SiO_2$ and $Si_3N_4$ may hinder the diffusion of P as the first dopant species.

As the second dopant species not hindered by the diffusion barrier, Ga may be chosen, for example.

It is to be understood that the features of the various embodiments described herein may be combined with each other unless specifically noted otherwise.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptions or variations of the specific embodiments discussed herein. Therefore, it is intended that this invention be limited only by the claims and the equivalents thereof.

What is claimed is:

1. A semiconductor device, comprising:
   first semiconductor zones of a first conductivity type including a first dopant species of the first conductivity type and a second dopant species of a second conductivity type different from the first conductivity type;
   second semiconductor zones of the second conductivity type including the second dopant species, the first and second semiconductor zones being alternately arranged in contact with each other along a lateral direction extending in parallel to a surface of a semiconductor body; wherein
   one of the first and second semiconductor zones constitute drift zones and a diffusion coefficient of the second dopant species is at least twice as large as the diffusion coefficient of the first dopant species; and
   a concentration profile of the first dopant species along a vertical direction perpendicular to the surface of the semiconductor body includes at least two maxima.

2. The semiconductor device of claim 1, wherein
   the first and second semiconductor zones are arranged between a semiconductor structure including a body and a source at a first surface of the semiconductor body and a drain at a second surface of the semiconductor body opposite to the first surface.

3. The semiconductor device of claim 1, wherein
   a maximum of a concentration profile of dopants of each of the first and second dopant species along the lateral direction is located in a center of each of the first semiconductor zones having a same lateral distance to the neighboring ones of the second semiconductor zones.

4. The semiconductor device of claim 1, wherein
   a concentration profile of the dopants of each of the first and second species at an interface between the first and second semiconductor zones is decreasing along the lateral direction from the first to the second semiconductor zones.

5. The semiconductor device of claim 1, wherein
   the first semiconductor zones and the second semiconductor zones are configured to electrically compensate each other by at least 80%.

6. Integrated circuit comprising the semiconductor device of claim 1, wherein the semiconductor device is one of Field Effect Transistor, Insulated Gate Bipolar Transistor, Solar Cell, pn junction detector.

7. The semiconductor device of claim 1, wherein each of the first or each of the second semiconductor zones is arranged within a trench respectively, the trench being formed within the semiconductor body.

8. A method of manufacturing the semiconductor device of claim 1, comprising:
   forming first semiconductor zones of a first conductivity type including a first dopant species of the first conductivity type and a second dopant species of a second conductivity type different from the first conductivity type;
   forming second semiconductor zones of the second conductivity type including the second dopant species, the first and second semiconductor zones being alternately arranged in contact with each other along a lateral direction extending in parallel to a surface of a semiconductor body; wherein
   one of the first and second semiconductor zones constitute drift zones and a diffusion coefficient of the second dopant species is chosen at least twice as large as the diffusion coefficient of the first dopant species; and formation of the first semiconductor zones includes forming a concentration profile of the first dopant species along a vertical direction perpendicular to the surface of the semiconductor body by ion implantation such that it includes at least two maxima.

9. The method of claim 1, wherein
   plural implant energies are used for implanting at least one of the first and second dopant species.

10. The semiconductor device of claim 2, further comprising
    a semiconductor region arranged between the drain and each the first and second semiconductor zones, the conductivity type of the semiconductor region being equal to the conductivity type of the drain.

11. The semiconductor device of claim 4, wherein
    a number of the maxima of the concentration profile of the first dopant species along the vertical direction perpendicular to the surface of the semiconductor body equals the number of maxima of the concentration profile of the second dopant species along the vertical direction.

12. The semiconductor device of claim 4, wherein
    a number of the maxima of the concentration profile of the first dopant species along the vertical direction perpendicular to the surface of the semiconductor body is larger than the number of maxima of the concentration profile of the second dopant species along the vertical direction.

13. The semiconductor device of claim 7, wherein each of the zones arranged within one of the trenches includes an epitaxial semiconductor layer formed on sidewalls of the respective trench, the epitaxial semiconductor layer filling the respective trench.

14. The method of claim 8, wherein formation of the first and second semiconductor zones comprises:
    forming at least one epitaxial semiconductor layer on a semiconductor substrate;
    implanting the first dopant species into the at least one epitaxial semiconductor layer by using at least two different implant energies;
    forming trenches into the at least one epitaxial semiconductor layer;
    filling the trenches with a filling material including at least a semiconductor material; and
    heating the at least one epitaxial semiconductor layer so as to diffuse the second dopant species into the semiconductor material within the trenches.

15. The method of claim 8, further comprising
    forming a semiconductor structure including a body and a source at a first surface of the semiconductor body;
    forming a drain at a second surface of the semiconductor body opposite to the first surface; and wherein
    the first and second semiconductor zones are arranged between the semiconductor structure and the drain.

16. The method of claim 8, wherein
the first and second dopant species are implanted into an overall surface area of the semiconductor body region defined by the first and second semiconductor zones.

17. The method of claim 8, wherein
an overall implant dose of the first and second dopant species differs by at least 20% with regard to the semiconductor body.

18. The method of claim 9, wherein
plural implant doses are used for implanting at least one of the first and second dopant species.

19. The method of claim 14, wherein
formation of the first and second semiconductor zones includes
implanting the first and second dopant species into the semiconductor body.

20. The method of claim 14, wherein
a plurality of epitaxial semiconductor layers are formed, wherein a thickness of each of the plurality of epitaxial semiconductor layer is set between 3 µm and 15 µm.

21. The method of claim 14, wherein
filling the trenches with a filling material includes
forming an epitaxial semiconductor layer on sidewalls of the trenches.

22. A semiconductor device, comprising:
first semiconductor zones of a first conductivity type including a first dopant species of the first conductivity type and a second dopant species of a second conductivity type different from the first conductivity type;
second semiconductor zones of the second conductivity type including the second dopant species, the first and second semiconductor zones being alternately arranged in contact with each other along a lateral direction extending in parallel to a surface of a semiconductor body;
wherein
one of the first and second semiconductor zones constitute drift zones and a diffusion coefficient of the second dopant species is at least twice as large as the diffusion coefficient of the first dopant species;
a concentration profile of the first dopant species along a vertical direction perpendicular to the surface of the semiconductor body includes at least two maxima; and
wherein materials of the first and second dopant species include P and In, Ga and P, B and Sb, In and Sb, Ga and Sb, B and As, In and As, or Ga and As.

23. A semiconductor device, comprising:
first semiconductor zones of a first conductivity type including a first dopant species of the first conductivity type and a second dopant species of a second conductivity type different from the first conductivity type;
second semiconductor zones of the second conductivity type including the second dopant species, the first and second semiconductor zones being alternately arranged in contact with each other along a lateral direction extending in parallel to a surface of a semiconductor body; wherein
one of the first and second semiconductor zones constitute drift zones and a diffusion coefficient of the second dopant species is at least twice as large as the diffusion coefficient of the first dopant species;
a concentration profile of the first dopant species along a vertical direction perpendicular to the surface of the semiconductor body includes at least two maxima; and
one of the first and second semiconductor zones include at least one epitaxial semiconductor layer on a semiconductor substrate.

24. A method of manufacturing the semiconductor device of claim 23, comprising:
forming first semiconductor zones of a first conductivity type including a first dopant species of the first conductivity type and a second dopant species of a second conductivity type different from the first conductivity type;
forming second semiconductor zones of the second conductivity type including the second dopant species, the first and second semiconductor zones being alternately arranged in contact with each other along a lateral direction extending in parallel to a surface of a semiconductor body; wherein
one of the first and second semiconductor zones constitute drift zones and a diffusion coefficient of the second dopant species is chosen at least twice as large as the diffusion coefficient of the first dopant species; and formation of the first semiconductor zones includes forming a concentration profile of the first dopant species along a vertical direction perpendicular to the surface of the semiconductor body by ion implantation such that it includes at least two maxima;
formation of the first and second semiconductor zones includes
forming a plurality of epitaxial semiconductor layers on a semiconductor substrate,
wherein after formation of at least two of the plurality of epitaxial semiconductor layers first dopant species are implanted into the respective epitaxial semiconductor layer;
forming trenches into the at least one epitaxial semiconductor layer;
filling the trenches with a filling material including at least a semiconductor material; and
heating plurality of epitaxial semiconductor layers so as to diffuse the second dopant species into the semiconductor material within the trenches.

25. The method of claim 24, further comprising
forming an oxide layer on a surface of the semiconductor body prior to heating of the plurality of epitaxial semiconductor layers, the oxide remaining during heating of the plurality of epitaxial semiconductor layers.

* * * * *